(12) United States Patent
Akram et al.

(10) Patent No.: US 6,396,291 B1
(45) Date of Patent: May 28, 2002

(54) METHOD FOR TESTING SEMICONDUCTOR COMPONENTS

(75) Inventors: Salman Akram; David R. Hembree, both of Boise; Warren M. Farnworth, Nampa; Derek Gochnour, Boise; Alan G. Wood, Boise; John O. Jacobson, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/723,101

(22) Filed: Nov. 28, 2000

Related U.S. Application Data

(62) Division of application No. 09/298,769, filed on Apr. 23, 1999, now Pat. No. 6,208,157, which is a division of application No. 08/916,434, filed on Aug. 22, 1999, now Pat. No. 6,072,326.

(51) Int. Cl.[7] .............................................. G01R 31/02
(52) U.S. Cl. ........................................ 324/755; 324/765
(58) Field of Search ................................. 324/754, 755, 324/760, 765, 72.5, 158.1

(56) References Cited

U.S. PATENT DOCUMENTS

| | | |
|---|---|---|
| 4,937,653 A | 6/1990 | Blonder et al. |
| 5,045,923 A | 9/1991 | Matsuoka |
| 5,073,117 A | 12/1991 | Malhi et al. |
| 5,088,190 A | 2/1992 | Malhi et al. |
| 5,172,050 A | 12/1992 | Swapp |
| 5,196,726 A | 3/1993 | Nishiguchi et al. |
| 5,302,891 A | 4/1994 | Wood et al. |
| 5,322,446 A | 6/1994 | Cearley-Cabbiness |
| 5,329,423 A | 7/1994 | Scholz |
| 5,341,564 A | 8/1994 | Akhavain et al. |
| 5,367,253 A | 11/1994 | Wood et al. |
| 5,408,190 A | 4/1995 | Wood et al. |
| 5,420,520 A | 5/1995 | Anschel et al. |
| 5,475,317 A | 12/1995 | Smith |
| 5,483,741 A | 1/1996 | Akram et al. |
| 5,495,179 A | 2/1996 | Wood et al. |
| 5,519,332 A | 5/1996 | Wood et al. |
| 5,541,525 A | 7/1996 | Wood et al. |
| 5,559,444 A | 9/1996 | Farnworth et al. |
| 5,578,934 A | 11/1996 | Wood et al. |
| 5,592,736 A | 1/1997 | Akram et al. |
| 5,629,837 A | 5/1997 | Barabi et al. |
| 5,633,122 A | 5/1997 | Tuttle |

(List continued on next page.)

OTHER PUBLICATIONS

Lorenz, H. et al., Suss Report. "Epon SU–8, A Low–Cost Negative Resist for Mems", vol. 10, Third Fourth Quarter, 1996, (no month available).

*Primary Examiner*—Michael J. Sherry
*Assistant Examiner*—Minh N. Tang
(74) *Attorney, Agent, or Firm*—Stephen A. Gratton

(57) ABSTRACT

A system and method for testing semiconductor components are provided. The system includes: a test board, sockets mounted to the test board in electrical communication with test circuitry, and carriers mounted to the sockets for housing the components. The carriers include bases, and interconnects mounted thereon, having contact members configured to make temporary electrical connections with contacts on the components. In addition, the contact members on the interconnects can be shaped to perform an alignment function, and to prevent excessive deformation of the contacts on the components. The sockets include camming members and electrical connectors configured to electrically contact the carriers with a zero insertion force. During a test procedure, the bases and interconnects can remain mounted to the sockets on the test board, as the components are aligned and placed in electrical contact with the interconnects. However, different bases and interconnects can be mounted to the sockets for testing different types of components.

20 Claims, 4 Drawing Sheets

U.S. PATENT DOCUMENTS

| | | |
|---|---|---|
| 5,634,267 A | 6/1997 | Farnworth et al. |
| 5,731,709 A | 3/1998 | Pastore et al. |
| 5,783,461 A | 7/1998 | Hembree |
| 5,815,000 A | 9/1998 | Farnworth et al. |
| 5,834,945 A | 11/1998 | Akram et al. |
| 5,844,418 A | 12/1998 | Wood et al. |
| 5,878,485 A | 3/1999 | Wood et al. |
| 5,896,036 A | 4/1999 | Wood et al. |
| 5,915,977 A | 6/1999 | Hembree et al. |
| 5,929,647 A | 7/1999 | Akram et al. |
| 5,931,685 A | 8/1999 | Hembree et al. |
| 5,949,242 A | 9/1999 | Wood et al. |
| 5,962,921 A | 10/1999 | Farnworth et al. |
| 5,982,185 A | 11/1999 | Farnworth et al. |
| 6,016,060 A | 1/2000 | Akram et al. |
| 6,018,249 A | 1/2000 | Akram et al. |
| 6,025,728 A | 2/2000 | Hembree et al. |
| 6,025,730 A | 2/2000 | Akram et al. |
| 6,025,731 A | 2/2000 | Hembree et al. |
| 6,040,239 A | 3/2000 | Akram et al. |
| 6,040,702 A | 3/2000 | Hembree et al. |
| 6,060,893 A | 5/2000 | Farnworth et al. |
| 6,060,894 A | 5/2000 | Hembree et al. |
| 6,072,323 A | 6/2000 | Hembree et al. |
| 6,072,326 A | 6/2000 | Akram et al. |
| 6,091,250 A | 7/2000 | Wood et al. |
| 6,091,251 A | 7/2000 | Wood et al. |
| 6,091,252 A | 7/2000 | Akram et al. |
| 6,094,058 A | 7/2000 | Hembree et al. |
| 6,130,148 A | 10/2000 | Farnworth et al. |
| 6,188,232 B1 | 2/2001 | Akram et al. |
| 6,204,678 B1 | 3/2001 | Akram et al. |
| 6,208,157 B1 * | 3/2001 | Akram et al. ............... 324/755 |
| 6,215,322 B1 | 4/2001 | Farnworth et al. |
| 6,222,379 B1 | 4/2001 | Farnworth et al. |
| 6,232,243 B1 | 5/2001 | Farnworth et al. |
| 6,255,833 B1 | 7/2001 | Akram et al. |
| 6,278,286 B1 | 8/2001 | Farnworth et al. |
| 6,313,651 B1 | 11/2001 | Hembree et al. |

* cited by examiner

```
┌─────────────────────────────────────────────┐
│ PROVIDING A TEST BOARD CONFIGURED FOR       │
│ ELECTRICAL COMMUNICATION WITH TEST          │
│ CIRCUITRY                                   │
└─────────────────────┬───────────────────────┘
                      │
┌─────────────────────┴───────────────────────┐
│ PROVIDING MULTIPLE SOCKETS ON THE TEST      │
│ BOARD IN ELECTRICAL COMMUNICATION WITH      │
│ THE TEST CIRCUITRY                          │
└─────────────────────┬───────────────────────┘
                      │
┌─────────────────────┴───────────────────────┐
│ PROVIDING MULTIPLE CARRIERS COMPRISING      │
│ CARRIER BASES AND INTERCONNECTS HAVING      │
│ CONTACT MEMBERS CONFIGURED TO ESTABLISH     │
│ TEMPORARY ELECTRICAL COMMUNICATION WITH     │
│ CONTACTS ON THE COMPONENTS                  │
└─────────────────────┬───────────────────────┘
                      │
┌─────────────────────┴───────────────────────┐
│ MOUNTING THE CARRIER BASES AND              │
│ INTERCONNECTS TO THE SOCKETS                │
└─────────────────────┬───────────────────────┘
                      │
┌─────────────────────┴───────────────────────┐
│ ALIGNING AND PLACING THE COMPONENTS IN      │
│ PHYSICAL AND ELECTRICAL CONTACT WITH THE    │
│ INTERCONNECTS                               │
└─────────────────────┬───────────────────────┘
                      │
┌─────────────────────┴───────────────────────┐
│ ATTACHING FORCE APPLYING MECHANISMS OF      │
│ THE CARRIERS TO THE CARRIER BASES           │
└─────────────────────┬───────────────────────┘
                      │
┌─────────────────────┴───────────────────────┐
│ TESTING THE COMPONENTS BY APPLYING TEST     │
│ SIGNALS THROUGH THE SOCKETS, CARRIER        │
│ BASES, AND INTERCONNECTS TO THE             │
│ COMPONENTS                                  │
└─────────────────────┬───────────────────────┘
                      │
┌─────────────────────┴───────────────────────┐
│ TESTING ANOTHER TYPE OF COMPONENT BY        │
│ REPLACING THE BASES AND INTERCONNECTS       │
│ AND REPEATING THE ABOVE STEPS               │
└─────────────────────────────────────────────┘
```

FIGURE 6

METHOD FOR TESTING SEMICONDUCTOR COMPONENTS

CROSS REFERENCE TO RELATED APPLICATIONS

This application is a division of application Ser. No. 09/298,769 filed on Apr. 23, 1999, now U.S. Pat. No. 6,208,157 B1, which is a division of application Ser. No. 08/916,434 filed Aug. 22, 1999, now U.S. Pat. No. 6,072,326.

FIELD OF THE INVENTION

This invention relates generally to semiconductor manufacture, and more particularly to an improved system and method for testing semiconductor components including bare dice and chip scale packages.

BACKGROUND OF THE INVENTION

Semiconductor components, such as unpackaged dice and chip scale packages, must be burned-in and tested prior to use in electronic equipment. One test procedure involves placing one or more semiconductor components in a test carrier. The carrier provides a container for handling and electrically connecting the components to a testing apparatus. The testing apparatus can include test circuitry adapted to transmit and analyze test signals from the components held within the carrier. The carrier and testing apparatus form a test system.

One requirement of carriers for testing semiconductor components, is the ability to make temporary electrical connections with the components. The temporary electrical connections permit test signals to be transmitted to the integrated circuits contained on the components. One type of carrier includes an interconnect adapted to make temporary electrical connections with contacts on the components. The contacts on unpackaged dice are typically flat or bumped bond pads formed on faces of the dice. The contacts on chip scale packages are typically solder bumps formed on substrates bonded to the faces of the dice.

These contacts on the components can be in the form of small, densely-packed members. For example, chip scale packages can include a hundred or more solder bumps having a diameter and spacing of several mils or less. Unpackaged dice can include bond pads having a width and spacing of several mils or less. The interconnect of the carrier must be able to make separate electrical connections to each contact without shorting or excessively damaging the contact.

The carrier must also include external contacts adapted to make electrical connections with the test apparatus. These externals contacts on the carrier must have a size and density corresponding to the size and density of the contacts on the components under test. In addition, the external contacts must be able to perform reliably in a production environment over an extended period of time.

Another consideration is the interface of the external contacts with the test apparatus. The test apparatus must be able to efficiently handle and electrically connect to a large number of individual carriers. The physical and electrical interface of the carriers and the test apparatus affects the performance of the test system to a large degree.

The present invention is directed to a system including a carrier with a dense array of external contacts and a socket adapted to physically and electrically connect to the external contacts.

SUMMARY OF THE INVENTION

In accordance with the present invention, an improved system and method for testing semiconductor components are provided. The system includes carriers for holding the components, and a test apparatus adapted to transmit test signals to the carriers and to analyze response signals from the components under test. The test apparatus includes a test board, and a plurality of separate sockets mounted to the test board, in electrical communication with test circuitry. Each socket is configured to physically and electrically engage a single carrier. The sockets include rows of electrical connectors for electrically contacting contacts on the carriers, and camming members for manipulating the electrical connectors to allow insertion and removal of the carriers. The electrical connectors and camming members allow the carriers to be inserted into the sockets with a zero insertion force.

The carriers include bases for holding multiple components, and multiple interconnects each adapted to establish temporary electrical communication with an individual component. The carrier bases also include the contacts which electrically contact the electrical connectors on the sockets mounted to the test board. The electrical interface between the contacts on the carrier bases, and the interconnects mounted to the carrier bases, can be wire bonding, flex circuit bonding or mechanical-electrical connectors.

In addition to the bases and interconnects, the carriers also include a force applying mechanism for biasing the components against the interconnects. The force applying mechanism include bridge clamps attachable to the carrier bases and metal or elastomeric spring members. In an illustrative embodiment the bases comprise ceramic with plated external contacts adapted to electrically engage electrical connectors on sockets mounted to the test board.

In accordance with the method of the invention the sockets can remain electrically connected to the test board. In addition, the carrier bases can remain electrically connected to the sockets with the interconnects thereon. During a test procedure, the components can be optically or mechanically aligned with the interconnects, and placed in physical and electrical contact therewith. Test signals can then be transmitted through the test board, sockets, carrier bases and interconnects to the components. As long as the same types of components are being tested, the carrier bases and interconnects can remain mounted to the same sockets on the test board. However, the bases and interconnects can also be easily removed from the sockets, and different bases and interconnects can be substituted for testing other types of components. Accordingly the configurations of the interconnects and carrier bases can be customized for a particular type of component, while the test board and socket configurations remain the same.

BRIEF DESCRIPTION OF THE DRAWINGS

FIG. 6 is a block diagram of steps in the method of the invention;

DETAILED DESCRIPTION OF THE PREFERRED EMBODIMENTS

Figure 1:
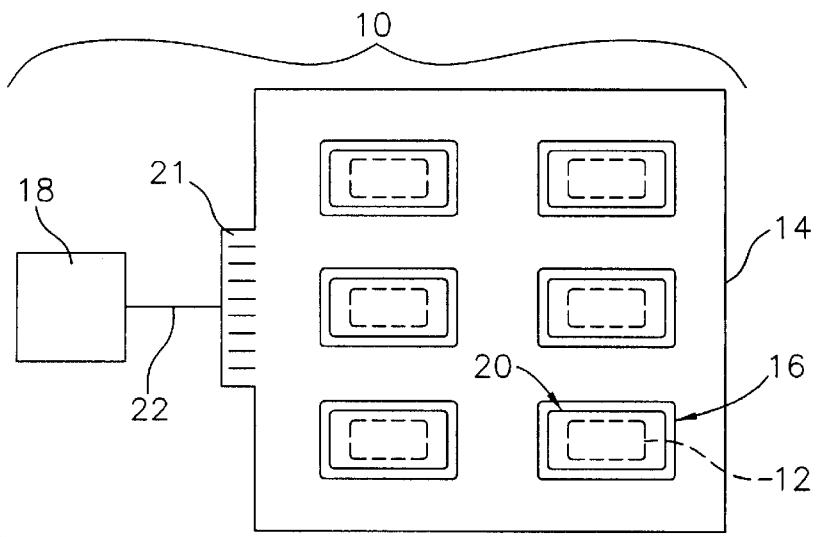
FIG. 1 is a schematic plan view of a system constructed in accordance with the invention.

Referring to FIG. 1, a system 10 adapted to test semiconductor components 12 is shown. In the illustrative embodiment, the semiconductor component 12 can be a bare die or a chip scale package. The system, broadly stated, includes: a test board 14; test circuitry 18 adapted to apply test signals through the test board 14 to the components 12 and to analyze the resultant signals; a plurality of sockets 16 mounted to the test board 14 in electrical communication with the test circuitry 18; and a plurality of carriers 20 adapted to contain the components 12 for testing.

The test board 14 can be formed of an electrically insulating material such as a ceramic, FR-4, glass filled plastic, or polyimides. The test board 14 can include an edge connector 21 electrically connectable to an electrical path 22 to the test circuitry 18. The test board 14 can also include electrical paths in the form of conductive traces or other elements adapted for electrical communication with the sockets 16.

The test circuitry 18 can be configured to test electrical parameters such as input and output voltages, capacitances, and currents for the integrated circuits contained on the components 12. In the case of components 12 having memory devices, the test circuitry 18 can also perform logic tests wherein data storage, retrieval capabilities and response times are measured. The test circuitry 18 can be in the form of conventional test circuitry manufactured by Teradyne, Advancetest, Hewlett Packard and others.

Figure 2A:
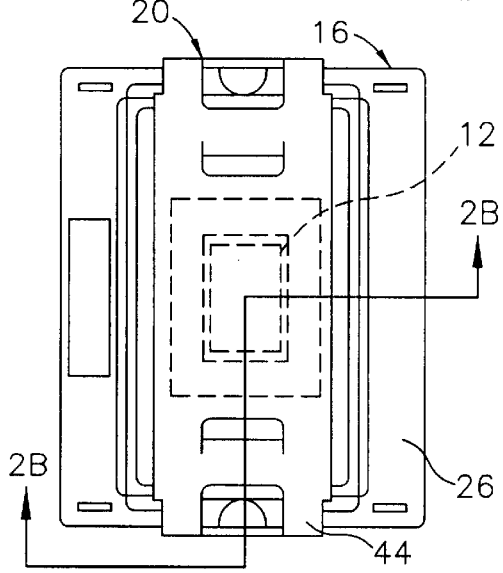
FIG. 2A is a plan view of a carrier and socket of the system.
Figure 2C:
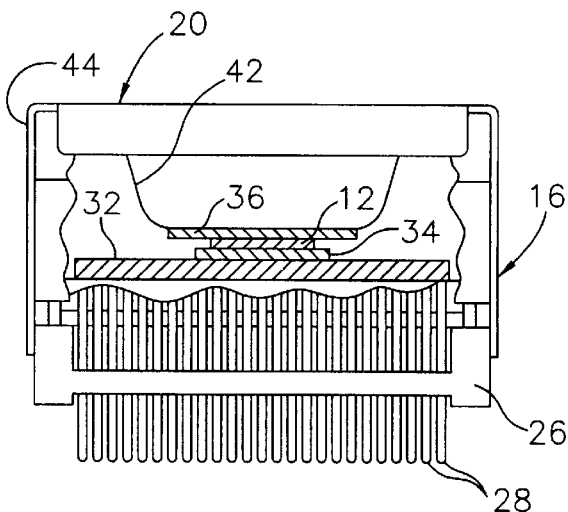
FIG. 2C is a side elevational view partially cut away of the carrier and socket.
Figure 2B:
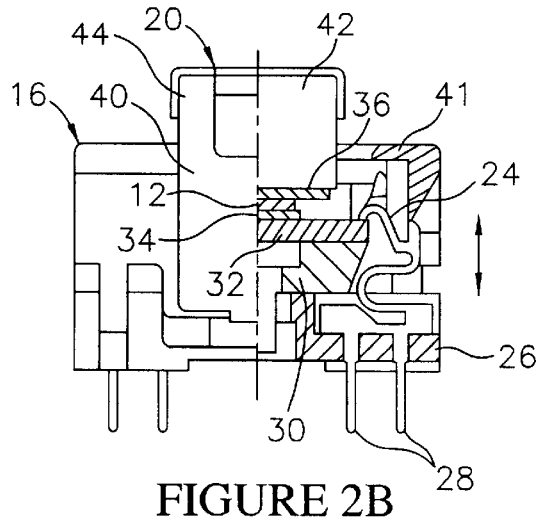
FIG. 2B is a cross sectional view of the carrier and socket taken along section line 2B—2B of FIG. 2A.

Referring to FIGS. 2A–2C, an individual socket 16 is shown. The socket 16 can be configured to receive the carrier 20 from above with a "zero insertion force". The socket 16 includes a socket base 26 with pin connectors 28 configured to electrically contact mating electrical receptacles (not shown) on the test board 14. The socket base 26 also includes rows of electrical connectors 24 (FIG. 2A) configured to electrically engage contacts 38 (FIG. 3) on the carrier 20. The electrical connectors 24 are in electrical communication with the pin connectors 28. In addition, the electrical connectors 24 are shaped to physically engage a camming member 41. The electrical connectors 24 can be formed of a flexible material such as beryllium copper, or "PALLINEY 7" available from J.M. Ney Company of Hartford, Conn.

Viewed from above, the camming member 41 is shaped like a window frame. The camming member 41 is movable in axially opposite directions as indicated by the double headed arrow in FIG. 2B. The camming member 41 includes a camming surface engageable with portions of the electrical connectors 24, substantially as shown in FIG. 2B. Depression of the camming member 41 towards the socket base 26 moves the electrical connectors 24 outward to provide clearance for inserting the carrier 20 into the socket 16. This allows the carriers 20 to be inserted into the sockets 16 with a "zero insertion force". With a manual system, the camming member 41 can be depressed by hand. With an automated system, the camming member 41 can be depressed by another actuator (not shown). Once the camming member 41 is released, the electrical connectors 24 provide a spring force for moving the camming member 41 axially upward away from the socket base 26 to its original position. At the same time, the electrical connectors 24 provide a spring force for electrically engaging the contacts 38 (FIG. 3) on the carrier 20.

The socket 16 also includes a support member 30 (FIG. 2B) adapted to support the carrier 20, and limit the axially downward movement of the carrier 20. In addition, the carrier 20 can be removed with a "zero removal force" by depression of the camming member 41 to disengage the electrical connectors 24 from the carrier 20. Other aspects of the socket 16 will become more apparent as the description proceeds.

Still referring to FIGS. 2A–2C, the carrier 20 includes the carrier base 32, and an interconnect 34 mounted to the carrier base 32. The carrier base 32 establishes electrical communication with the socket 16. The interconnect 34 is electrically connected to the carrier base 32 and establishes temporary electrical communication with the component 12. The carrier 20 can also includes a force applying mechanism in the form of a pressure plate 36, a spring 42, and a bridge clamp 44. The force applying mechanism biases the component 12 against the interconnect 34. These components will be described in detail as the description proceeds.

Figure 3:
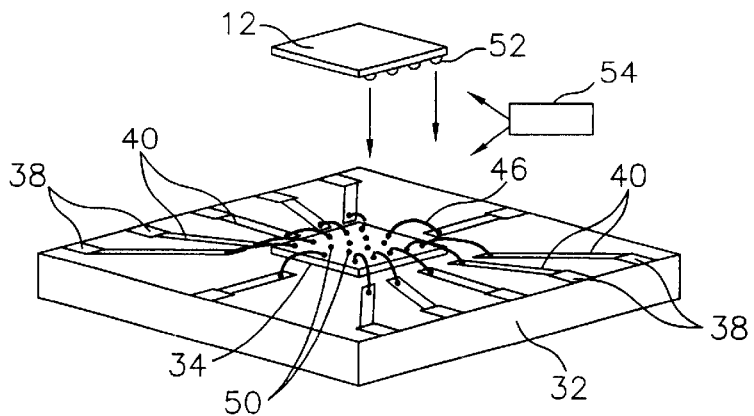
FIG. 3 is a schematic perspective view of a base and interconnect of the carrier illustrating optical alignment of a semiconductor component with the interconnect.

Referring to FIG. 3, the carrier base 32 and interconnect 34 are shown separately. Preferably, the carrier base 32 comprises an electrically insulating material such as ceramic, plastic, photomachineable glass, or FR-4. The carrier base 32 includes patterns of conductors 40 formed on a face surface thereof. The conductors 40 include the contacts 38, which are formed along the periphery of the carrier base 32. Each conductor 40 has an associated contact 38. The contacts 38 are adapted to electrically contact the electrical connectors 24 (FIG. 2B) on the socket base 26 (FIG. 2B). The conductors 40 on the carrier base 32 are adapted for electrical communication with corresponding conductors 48 (FIG. 4A) on the interconnect 34.

The interconnect 34 mounts to the carrier base 32. Bond wires 46 can be used to form separate electrical paths between the conductors 40 on the carrier base 32 and the conductors 48 (FIG. 4A) on the interconnect 34. Alternately these electrical paths can be formed with flex circuit or mechanical-electrical connectors. If desired, an electrically insulating adhesive, such as silicone, can be used to secure the interconnect 34 to the carrier base 32.

The conductors 40 on the carrier base 32 can be formed of a highly conductive metal such as aluminum, iridium, copper, gold, tungsten, tantalum, molybdenum or alloys of these metals. The contacts 38 can be formed of the same metals and preferably aluminum or gold for wire bonded configurations. The contacts 38 and conductors 40 can be formed using a thick film metallization process such as electro-deposition, stenciling or screen printing. The contacts 38 and conductors 40 can also be formed using a thin film metallization process such as photopatterning and etching a blanket deposited metal layer.

Still referring to FIG. 3, the interconnect 34 includes contact members 50 configured to establish temporary electrical communication with bumped contacts 52 on the semiconductor component 12. The bumped contacts 52 are typically contained on bumped bare dice used for flip chip bonding, and on bumped chip scale packages. Typically, the bumped contacts 52 are formed of a lead/tin solder (e.g. 63Pb/37Sn, 95Pb/5Sn). Each bumped contact 52 can be generally hemispherical, convex, or dome-shaped, with an outside diameter of from 1 to 30 mils.

For testing the component 12, the bumped contacts 52 can be aligned with the contact members 50 on the interconnect 34. Following alignment, the component 12 can be placed in physical and electrical contact with the interconnect 34. One method for aligning the bumped contacts 52 on the component 12 with the contact members 50 on the interconnect 34 is with an optical alignment system 54. Alternately, as will be further explained, a mechanical alignment system can be employed. The optical alignment system 54 can include split vision optics configured to view the bumped contacts 52 and the contact members 50 at the same time. The optical alignment system 54 can also include a mechanism for moving the component 12 (or interconnect 34) in x, y and z directions to align and place the bumped contacts 52 and contact members 50 in physical and electrical contact. An optical alignment system is described in further detail in U.S. Pat. No. 5,634,267 entitled "Method And Apparatus For Manufacturing Known Good Semiconductor Die", incorporated herein by reference.

Figure 4A:
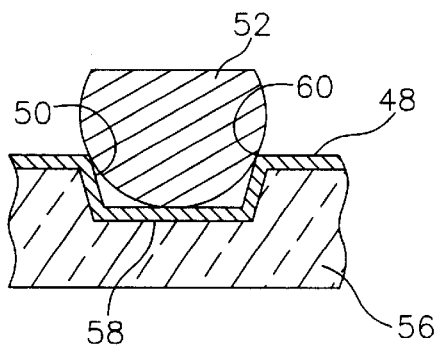
FIG. 4A is an enlarged schematic cross sectional view taken along section line 4A—4A of FIG. 4 illustrating engagement of a contact bump on the component with a contact member on the interconnect.
Figure 4:
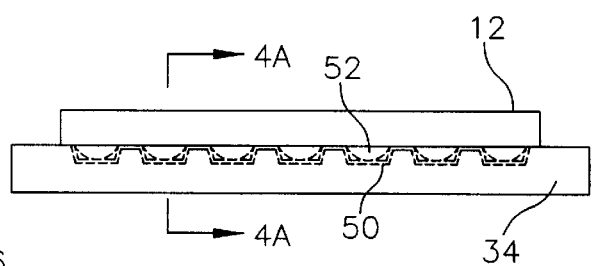
FIG. 4 is a schematic side elevational view of the component and interconnect in the assembled carrier.

FIG. 4 illustrates the component 12 after being aligned and placed in electrical contact with the interconnect 34. For simplicity the other components of the system 10 are not shown in FIG. 4. However, during a typical test procedure the carrier base 32 (FIG. 2B) and interconnect 34 of the carrier 20 (FIG. 2B) will initially be mounted to the socket base 26 (FIG. 2B). The component 12 can then be aligned with the interconnect 34 as explained above. Following alignment, the component 12 can be placed in physical and electrical contact with the interconnect 34, and the bridge clamp 44 attached to the carrier base 32. In this configuration the pressure plate 36 and spring 42 bias the component 12 against the interconnect 34.

As long as the same types of components 12 are being tested, the carrier base 32 and interconnect 34 can remain attached to the socket base 26 (FIG. 2B). However, for testing different types of components, the carrier base 32 and interconnect 34 can be removed from the socket base 26, and a different carrier base 32 and interconnect 34 substituted to accommodate the particular components being tested. For example, one semiconductor manufacturing process may entail testing a component having a particular configuration of bumped or flat bond pads. A particular carrier base 32 and interconnect 34 can be used in this application. However, the carrier base 32 and interconnect 34 can be easily changed for testing a component with a different configuration of bumped or flat bond pads.

As shown in FIG. 4, the contact members 50 on the interconnect 34 are adapted to electrically engage the bumped contacts 52 on the component 12. FIG. 4A illustrates the construction of the contact members 50. Each contact member 50 is configured to retain and electrically engage a single bumped contact 52. Each contact member 50 comprises an indentation covered with a conductive layer 58.

The indentations for the contact members 50 can be etched, machined, or otherwise formed in a substrate 56 of the interconnect 34. With the substrate 56 comprising silicon, the indentations can be anisotropically etched with sloped walls, using a wet etchant, such as KOH. The indentations for the contact members 50 can also be formed by a physical ablation process such as laser machining. Still further, with the substrate 56 comprising a photosensitive ceramic, the indentations can be formed using a photo machining process.

Preferably, the sidewalls of the contact members 50 are angled to provide guidance and fine alignment for the bumped contacts 52. Depending on the size and pitch of the bumped contacts 52, the contact members 50 can also provide a mechanical alignment system for aligning the component 12 to the interconnect 34. The angled sidewalls also prevent the bumped contacts 52 from sticking to the contact members 50.

Still referring to FIG. 4A, the sidewalls of the contact members 50 can be plated with conductive layers 58 in electrical communication with patterns of conductors 48. The conductive layers 58 and conductors 48 can be formed of a highly conductive metal such as aluminum, iridium, copper, gold, tungsten, tantalum, molybdenum or alloys of these metals. The conductive layers 58 and conductors 48 can be formed using a suitable metallization process (e.g., deposition, photopatterning, etching). If desired, separate metallization processes can be used for the conductive layers 58 and conductors 48. In addition, the conductive layers 58 and conductors 48 can be formed as multi-layered stacks of metals (e.g., bonding layer/barrier layer). Still further, the conductors 48 can be electrically insulated with an outer insulating layer (not shown).

The conductive layers 58 can also be formed of a material that is non-reactive with the bumped contacts 52. For bumped contacts 52 formed of solder, suitable materials for the conductive layers 58 include Be, Mg, Ca, Ba, Sc, Y, La, Ti, Zr, Hf, V, Nb, Ta, Mo, W, Tc, Re, B, C, Si, Ge and alloys of these materials.

Some of these materials, such as the metals, can be easily plated or metallized in suitable patterns. An exemplary metallization process is disclosed in U.S. Pat. No. 5,607,818, incorporated herein by reference. Other of the above materials can be deposited as alloys or in combination with other elements. For example, the conductive layers 58 can comprise a metal silicide such as $TiSi_2$, $WSi_2$, $TaSi_2$, $MoSi_2$, $PtSi_2$. In this case, a silicon containing layer and a metal layer can be deposited and then reacted to form a metal silicide. An exemplary metal silicide deposition process is disclosed in U.S. Pat. No. 5,483,741, incorporated herein by reference. Still further, other alloys such as TiN, TiW, TiC and NiB can be deposited using CVD or other deposition process.

In the illustrative embodiment, the conductors 48 (FIG. 4A) on the interconnect 34 are wire bonded using bond wires 46 (FIG. 3) to the conductors 40 (FIG. 3) on the carrier base 32 (FIG. 3). As shown in FIG. 4A, the conductive layers 58 include edges 60 formed by the indentations for the contact members 50. The edges 60 are adapted to penetrate oxide layers on the bumped contacts 52 to make low resistance electrical connections.

Figure 4B:
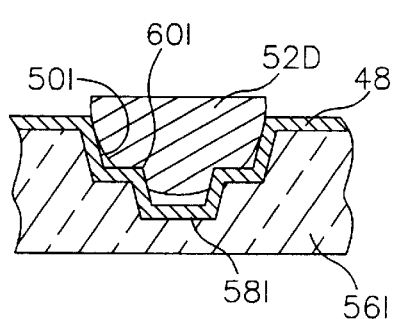
FIG. 4B is an enlarged schematic cross sectional view equivalent to FIG. 4A illustrating engagement of a contact bump on the component with an alternate embodiment contact member on the interconnect.

Referring to FIG. 4B, an alternate embodiment contact member 50I is illustrated. In the embodiment illustrated in FIG. 4B, the contact members 50I again comprise indentations formed in substrate 56I and covered with conductive layers 58I. However, the indentations have a stepped-pyramidal, or inverted "ziggurat" shape, comprising an upper cavity with sloped walls, and a smaller lower cavity with sloped walls. Because of size variations in the contact bumps 52 and large biasing forces, some contact bumps 52 may press into the lower cavity of the contact members 50I to form a deformed bump 52D. In this case the upper cavity sidewalls of the contact members 50I limit further deformation of the contact bumps 52.

Figure 5A:
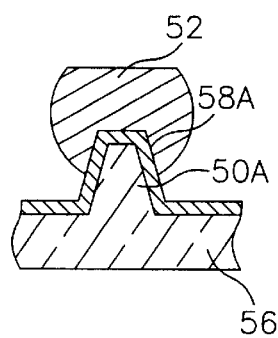
FIGS. 5A–5D are enlarged schematic cross sectional views equivalent to FIG. 4A of alternate embodiment contact members.
Figure 5B:
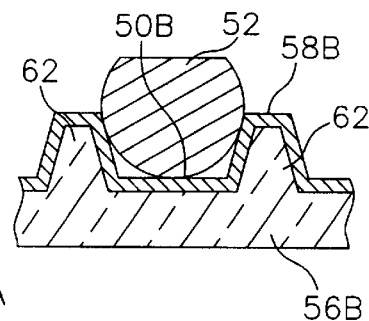

Referring to FIGS. 5A–5D, alternate embodiment contact members 50A–50D for the interconnect 34 are illustrated. In FIG. 5A, a contact member 50A comprises a projection formed on a substrate 56A and covered with a conductive layer 58A. The contact member 50A is configured to penetrate the contact bumps 52 to form a low resistance electrical connection. In FIG. 5B, a contact member 50B comprises multiple projections 62 configured to retain and electrically contact the contact bumps 52. The projections 62 can be formed on a substrate 56B and covered with a conductive layer 58B.

The alternate embodiment contact members 50A–50D, and other types of contact members, are further described in U.S. patent application Ser. No. 08/829,193, now U.S. Pat. No. 5,962,921, entitled "Interconnect Having Recessed Contact Members With Penetrating Blades For Testing Semiconductor Dice And Packages With Contact Bumps" and in U.S. patent application Ser. No. 08/823,490, now U.S. Pat. No. 6,016,060, entitled "Method, Apparatus, And System For Testing Bumped Semiconductor Components", both of which are incorporated herein by reference.

Figure 5C:
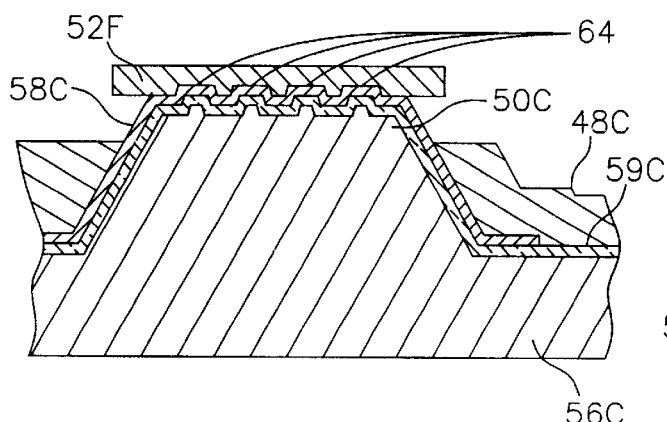
Figure 5D:
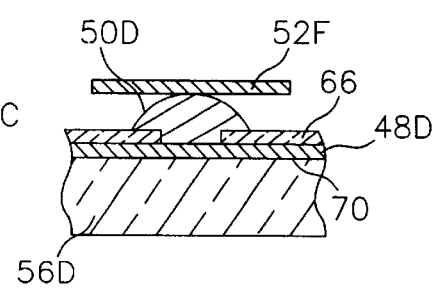

In FIG. 5C, a contact member 50C is configured to electrically engage a flat contact 52F on the component 12. The flat contact 52F can be a bond pad, test pad, land pad or similar member. The contact member 50C comprises a raised pillar on a substrate 56C, and includes penetrating projections for penetrating the flat contact 52F to a limited penetration depth. A conductive layer 58C on the contact member 50C is in electrical communication with conductors 48C as previously described. In FIG. 5D, a contact member 50D comprises metal microbumps and conductors 48D mounted on tape 66 attached to a substrate 56D with an electrically insulating adhesive layer 70. Contact members 50C and 50D are further described in U.S. Pat. No. 5,519,332, entitled "Carrier For Testing An Unpackaged Semiconductor Die", and in U.S. Pat. No. 5,483,741 entitled "Method For Fabricating A Self Limiting Silicon Based Interconnect For Testing Bare Semiconductor Dice", both of which are incorporated herein by reference.

Referring to FIG. 6, broad steps in a method for testing semiconductor components 12 using the system 10 of FIGS. 1–5D are illustrated. These steps include:

Providing a test board configured for electrical communication with test circuitry, step A.

Providing multiple sockets on the test board in electrical communication with the test circuitry, step B.

Providing multiple carriers comprising carrier bases and interconnects having contact members configured to establish temporary electrical communication with contacts on the components, step C.

Mounting the carrier bases and interconnects to the sockets, step D.

Aligning and placing the components in physical and electrical contact with the interconnects, step E.

Attaching force applying mechanisms of the carriers to the carrier bases, step F.

Testing the components by applying test signals through the sockets, carrier bases, and interconnects to the components, step G.

Testing another type of component by replacing the bases and interconnects and repeating the above steps, step H.

Figure 7A:
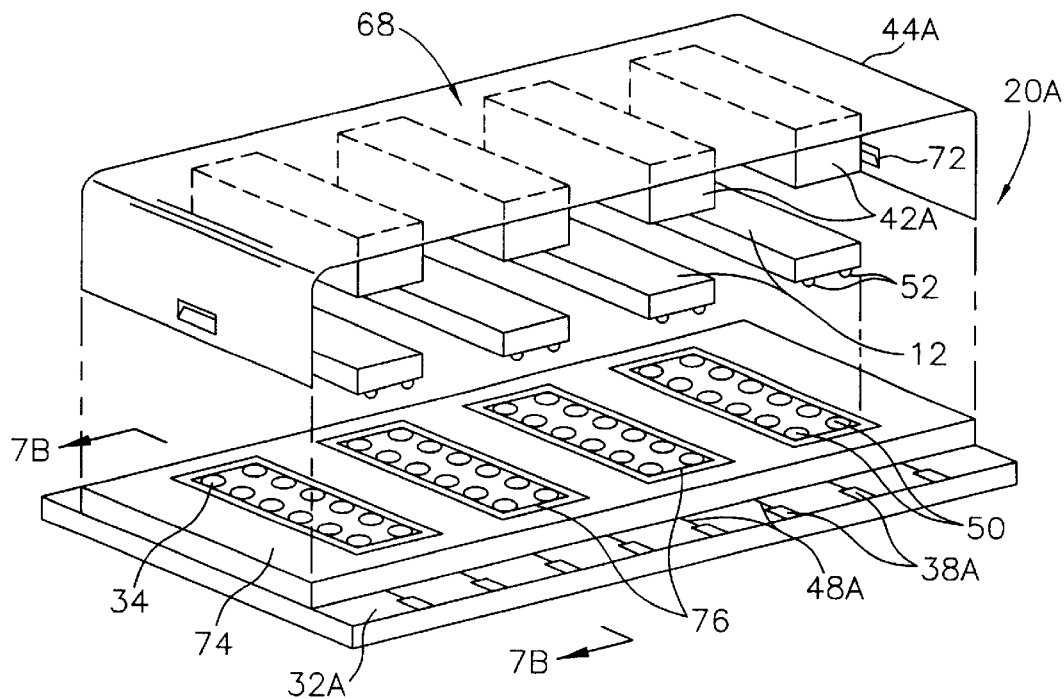
FIG. 7A is a schematic plan view of an alternate embodiment carrier.
Figure 7B:
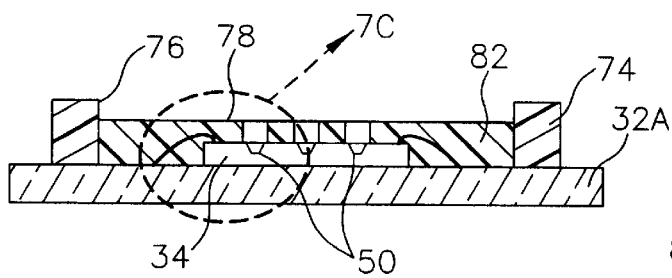
FIG. 7B is a cross sectional view taken along section line 7B—7B of FIG. 7A.
Figure 7D:
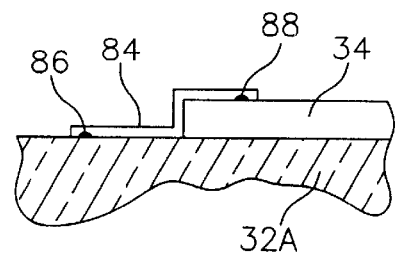
FIG. 7D is an enlarged cross sectional view equivalent to FIG. 7C of an alternate embodiment flex circuit connection.
Figure 7C:
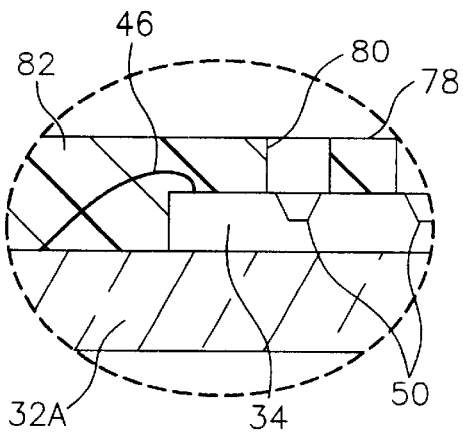
FIG. 7C is an enlarged cross sectional view taken along section line 7C of FIG. 7B showing an encapsulated wire bonded connection.

Referring to FIGS. 7A–7C, an alternate embodiment carrier 20A is illustrated. Carrier 20A functions in substantially the same manner as carrier 20, but differs in that it is configured to test multiple components 12. The carrier 20A includes a carrier base 32A having contacts 38A configured for electrical contact by the electrical connectors 24 (FIG. 2B). In addition, the carrier 20A includes multiple interconnects 34 having contact members 50 formed substantially as previously described. The carrier 20A also includes a force applying mechanism 68 comprising a bridge clamp 44A with clip portions 72 that attach to the carrier base 32A. In addition, the force applying mechanism 68 includes springs 42A configured to bias the components 12 against the interconnects 34. The springs 42A can be formed of metal as previously described, or of an elastomeric material such as silicone, butyl rubber, or fluorosilicone. One suitable elastomeric material is commercially available from Rogers Corporation, Elk Grove Village, Ill. under the trademark "PORON".

As shown in FIG. 7B, the carrier 20A also includes a coarse alignment member 74 adapted to coarse align the components 12 to the interconnects 34. In the illustrative embodiment, the coarse alignment member 74 comprises a polymer fence formed on the carrier base 32A. One suitable polymer for forming the coarse alignment member 74 comprises a negative tone resist, which is blanket deposited to a desired thickness, exposed, developed and then cured. A suitable resist formulation is sold by Shell Chemical under the trademark "EPON RESIN SU-8". Such a resist can be deposited to a thickness of from about 5–50 mils. A conventional resist coating apparatus, such as a spin coater or a meniscus coater, can be used to deposit the resist onto the carrier base 32A. The deposited resist can then be "prebaked" at about 95° C. for about 15 minutes and exposed in a desired pattern using a conventional UV aligner with a dose of about 165 mJ/cm$^2$. Developing can be accomplished with a solution of PGMEA (propyleneglycol-monomethylether-acetate). This can be followed by a hard bake at about 200° C. for about 30 minutes.

As shown in FIG. 7B, the hard baked coarse alignment member 74 includes patterns of alignment openings 76. Each alignment opening 76 is sized and shaped to contact the peripheral edges of a component 12, to align the components 12 to the interconnects 76. This provides coarse alignment of the bumped contacts 52 on the components 12 to the contact members 34 on the interconnects 10A. As used herein, the term "coarse alignment" refers to a first alignment stage in which a registration between the bumped contacts 52 and contact members 34 is from about 1 mil to 6 mils.

As also shown in FIGS. 7B, in addition to the coarse alignment member 74 on the carrier base 32A, a fine alignment member 78 can be formed on the interconnects 34. The fine alignment member 78 includes alignment openings 80 (FIG. 7C) configured to align individual bumped contacts 52 on the components 12 to individual contact members 50 on the interconnects 34. As used herein, the term "fine alignment" refers to a second alignment stage in which a registration between the bumped contacts 52 and contact members 50 is from about 1 mil to 3 mils.

The fine alignment member 78 can comprise a same deposited polymer as the coarse alignment member 74. The size of the alignment openings 80 on the fine alignment member 78 is dependent on the sizes of the bumped contacts 52. A representative diameter for the alignment openings 80 for 12 mil diameter bumped contacts 52 can be from 13 mils to 15 mils. Preferably the fine alignment member 78 has a thickness that is less than an average height of the bumped contacts 52. This thickness is preferably from about 3 mils to 7 mils.

As shown in FIG. 7C, an encapsulant layer 82 can also be deposited on the base 32A to encapsulate bond wires 46 and portions of the interconnects 34. The bond wires 46 establish electrical communication between the conductors 48 (FIG. 4A) on the interconnects 34, and the conductors 40A on the base 32A. The bond wires 46 can be wire bonded to the bonding sites on the conductors 48 (FIG. 4A) and 40A (FIG. 7A).

The encapsulant layer 82 can be formed on the base 32A after the coarse alignment member 74 and fine alignment members 78 have been formed. The encapsulant layer 82 can be formed of curable material such as an epoxy, silicone, polyimide or room temperature vulcanizing material. This encapsulant layer 82 can be applied in the manner of a "glob top" using a dispensing nozzle, or can be applied using a spatula tool, and then cured as required.

In the assembled carrier 20A, the components 12 are biased against the interconnects 34 by the force applying mechanism 68. As before, the interconnects 34 and base 32A can remain with the socket 16 (FIG. 2A) for testing the same type of component 12 but then changed for testing different types of components 12.

FIG. 7D illustrates an alternate embodiment wherein flex circuit 84 forms the electrical interface between the interconnect 34 and carrier base 32A. The flex circuit 84 can comprise a multi-layered tape such as TAB tape, or ASMAT manufactured by Nitto Denko. The flex circuit 84 can include patterns of conductors having bonded connections 86, 88 with the interconnect 34 and carrier base 32A. The flex circuit 84 can also include a ground or voltage plane for matching an impedance of the conductors thereon to other system components.

Figure 7E:
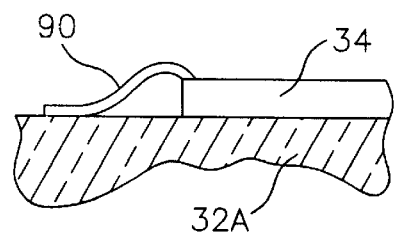
FIG. 7E is an enlarged cross sectional view equivalent to FIG. 7C of an alternate embodiment mechanical-electrical connection.

FIG. 7E illustrates another alternate embodiment wherein mechanical electrical connectors 90, such as spring clips, form the electrical interface between the interconnect 34 and carrier base 32A. This type of direct connect interconnect 34 is further described in U.S. patent application Ser. No. 08/673,930, now U.S. Pat. No. 5,982,185, entitled "Direct Connect Carrier For Testing Semiconductor Dice And Method Of Fabrication", incorporated herein by reference.

Thus the invention provides an improved system and method for testing semiconductor components including bare dice and chip scale packages. While the invention has been described with reference to certain preferred embodiments, as will be apparent to those skilled in the art, certain changes and modifications can be made without departing from the scope of the invention as defined by the following claims.

What is claimed is:

1. A method for testing a semiconductor component comprising:
   providing a test board;
   providing a socket on the test board comprising a plurality of electrical connectors and a camming member for manipulating the electrical connectors;
   providing a base for holding the component comprising a plurality of contacts, and an interconnect on the base in electrical communication with the contacts configured to establish temporary electrical communication with the component;
   inserting the base into the socket using the camming member to place the electrical connectors in electrical communication with the contacts;
   placing the component on the base in electrical communication with the interconnect; and
   applying test signals through the electrical connectors, the contacts and the interconnect to the component.

2. The method of claim 1 wherein the camming member is configured to allow the base to be inserted into the socket with a zero insertion force.

3. The method of claim 1 wherein the interconnect comprises an alignment member for aligning the component on the interconnect.

4. The method of claim 1 wherein the interconnect comprises an alignment member having an opening for contacting an edge of the component for aligning the component on the interconnect.

5. The method of claim 1 wherein the component comprises a die or a package.

6. The method of claim 1 wherein the component comprises a plurality of bumped contacts and the interconnect comprises a plurality of contact members in electrical communication with the contacts on the base configured to electrically engage the bumped contacts.

7. The method of claim 1 further comprising removing the component from the base; placing a different component on the base; and applying test signals through the electrical connectors, the contacts and the interconnect to the different component.

8. The method of claim 1 further comprising providing a second base having second contacts, and a second interconnect; inserting the second base into the socket using the camming member to place the electrical connectors in electrical communication with the second contacts; placing a second component on the second interconnect having a different configuration than the component; and applying test signals through the electrical connectors, the second contacts and the second interconnect to the second component.

9. The method of claim 1 wherein the base comprises an element of a test carrier configured to temporarily package the component.

10. The method of claim 1 further comprising providing a force applying mechanism on the base configured to bias the component and the interconnect together.

11. The method of claim 1 further comprising providing a clamp on the base and a spring on the clamp configured to bias the component and the interconnect together.

12. The method of claim 1 further comprising providing a test circuitry in electrical communication with the electrical connectors configured to apply the test signals.

13. The method of claim 1 wherein the camming member comprises a camming surface engageable with the electrical connectors.

14. The method of claim 1 wherein the electrical connectors provide a spring force for engaging the contacts on the base.

15. The method of claim 1 wherein the electrical connectors provide a spring force for moving the camming member.

16. The method of claim 1 wherein the base comprises a material selected from the group consisting of ceramic, plastic, and glass.

17. The method of claim 1 further comprising providing a plurality of sockets on the test board.

18. The method of claim 1 wherein the camming member is configured to allow the base to be removed from the socket with a zero removal force.

19. The method of claim 1 wherein the socket includes a support member configured to support the base.

20. The method of claim 1 further comprising aligning the component to the interconnect prior to the placing step.

* * * * *